United States Patent [19]

Vossen, Jr. et al.

[11] 4,372,807
[45] Feb. 8, 1983

[54] PLASMA ETCHING OF ALUMINUM

[75] Inventors: John L. Vossen, Jr., Bridgewater, N.J.; Bernard Halon, Brooklyn, N.Y.

[73] Assignee: RCA Corporation, New York, N.Y.

[21] Appl. No.: 362,041

[22] Filed: Mar. 25, 1982

[51] Int. Cl.³ ............................................. C23F 1/02
[52] U.S. Cl. .................................. 156/643; 156/646; 156/656; 156/659.1; 156/665; 204/192 E; 252/79.1
[58] Field of Search ............... 156/643, 646, 656, 665, 156/659.1; 252/79.1; 204/192 E, 164; 427/38, 39

[56] References Cited

U.S. PATENT DOCUMENTS 4,333,793  6/1982  Lifshitz et al. ............... 156/659.1 X
4,343,677  8/1982  Kinsbron et al. ............. 156/652 X

FOREIGN PATENT DOCUMENTS 54-140478  10/1979  Japan .................................. 156/643

OTHER PUBLICATIONS

Vossen, *Pure and Applied Chemistry*, vol. 52, pp. 1759-1765 (1980).

Primary Examiner—William A. Powell
Attorney, Agent, or Firm—Birgit E. Morris; R. Hain Swope

[57] ABSTRACT

A method of improving the uniformity and line-width control in the plasma etching of aluminum and its alloys by adding to the etchant gas an effective amount of a gaseous hydrocarbon which will polymerize under glow discharge conditions.

7 Claims, 1 Drawing Figure

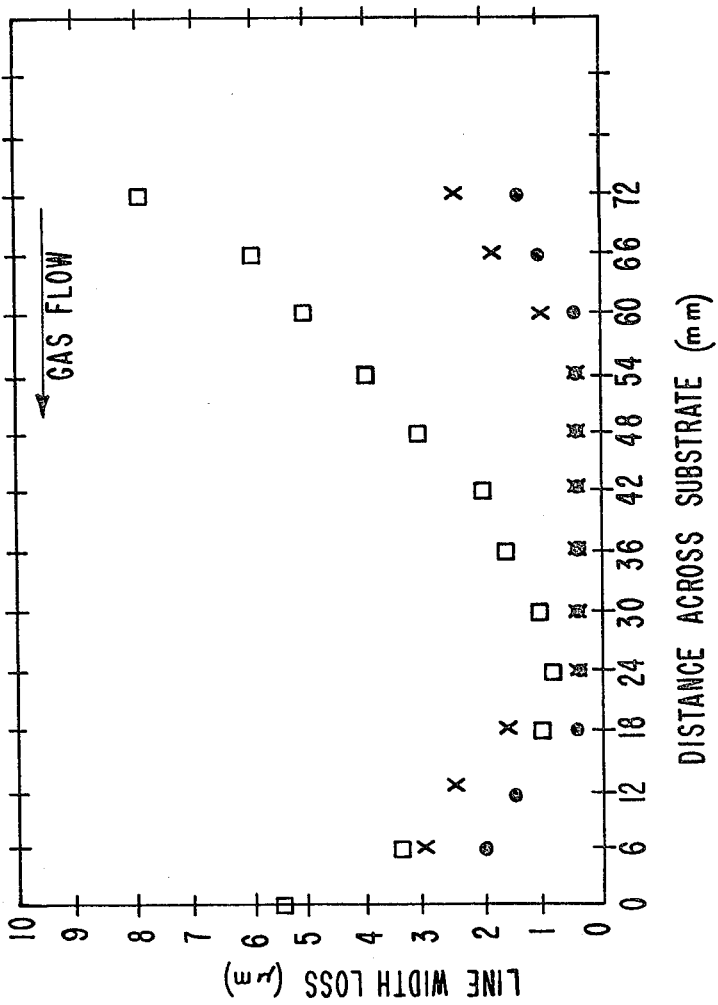

PLASMA ETCHING OF ALUMINUM

This invention relates to the plasma etching of aluminum and its alloys. More particularly, this invention pertains to a method of improving the uniformity and line-width control in plasma etching of aluminum.

BACKGROUND OF THE INVENTION

The importance of etching aluminum and its alloys has increased significantly within the last several years. As the electronics industry has moved into production of very large scale integrated circuits (VLSI), the need for methodology which meets the requirements for their production has become increasingly acute.

The high-density, i.e. fine-line, geometries necessary for VLSI circuits make it essential that etching is anisotropic to achieve faithful delineation of patterns. It is well documented in the literature that anisotrophy is possible only where there is ion bombardment of the surface being etched. This does not mean, however, that etching will not take place if there is no ion bombardment.

The gases which must be utilized in the plasma etching of aluminum are highly reactive and form reactive species which are long-lived. The presence of these reactive species on side walls of etched steps will result in undercutting to some degree, depending on the lifetime of the species. This undercutting is a significant problem in VLSI production because of the need for anisotropic etching. A solution to this problem of undercutting is provided in accordance with this invention.

SUMMARY OF THE INVENTION

A method of preventing undercutting in the plasma etching of aluminum or its alloys is provided. The improvement of this invention comprises the addition of an effective amount of a polymerizable gaseous hydrocarbon to the etchant gas mixture.

BRIEF DESCRIPTION OF THE DRAWING

The FIGURE is a plot of loss of line width in the plasma etching of aluminum according to this invention versus distance across a substrate comparing the process of the invention and the prior art method.

DETAILED DESCRIPTION OF THE INVENTION

This invention is directed to improving the anisotropic quality of plasma etching of aluminum. Generally, plasma etching is believed to include the following five steps:
 (a) reactive gaseous atoms are produced in a glow discharge by dissociation of an etchant gas;
 (b) the reactive gaseous atoms are adsorbed onto the surface being etched;
 (c) the adsorbed reactive gaseous atoms are excited by ion bombardment;
 (d) the excited atoms react with surface atoms to form volatile compounds; and
 (e) the volatile compounds are desorbed by heat and/or ion bombardment and are pumped away.

While iom bombardment is necessary for effective anisotropic etching, etching will take place on the side walls of etched steps without ion bombardment if the lifetime of the adsorbed reactive gaseous atoms is sufficiently long.

In the instance of the plasma etching of aluminum, the etchant gases utilized are predominately chlorine-containing gases. Such gases, e.g. boron trichloride, alone or in combination with chlorine or chlorine plus helium, will provide long-lived, chlorine-containing gaseous atoms in the glow discharge which will cause undercutting of the aluminum on the side walls of etched steps. This is a significant disadvantage in the production of VSLI devices. Because there is no practical way to reduce the lifetime of these reactive atoms, some means must be found to reduce their effectiveness in undercutting the side walls in the aluminum substrate.

The integrity of the sidewalls in aluminum plasma etching has been enhanced in accordance with this invention by adding to the etchant gas mixture an effective amount of a gaseous hydrocarbon which will polymerize under conditions of glow discharge. By effective amount is meant an amount of gaseous hydrocarbon which will polymerize on the sidewalls of etched aluminum to a degree sufficient to significantly reduce or prevent sidewise etching, i.e. undercutting. The amount of gaseous hydrocarbon must, however, not be so great as would polymerize at such a rate as to block the desired vertical etching.

Suitable gaseous hydrocarbons useable in the method of this invention are those which will polymerize under the conditions conventional in the plasma etching of aluminum. Preferred gaseous hydrocarbons are cyclopropane and ethylene. Other hydrocarbons, e.g. those which will degrade to such gaseous hydrocarbons, are likewise useable in the method of this invention. These hydrocarbons may be utilized individually or in mixtures.

The amount of gaseous hydrocarbon to be added to the etchant gas mixture in accordance with this invention is from about $7 \times 10^{-6}$ about $2.5 \times 10^{-5}$ percent by volume, based on the etchant gas mixture. These percentages are based on a typical total flow of etchant gas into the etching chamber of about 50 sccm at about 125 mtorr pressure. These percentages will change somewhat with changes in gas flow and pressure. For example, doubling values, i.e. 100.5 sccm total gas flow and 250 mtorr pressure, the range of gaseous hydrocarbon added to the etchant gas mixture is reduced to from about $1 \times 10^{-6}$ to about $3.5 \times 10^{-6}$ percent by volume. These values are considered to be well within the skill of the art.

The etching conditions utilized in accordance with this invention are those conventionally utilized with the particular etchant gas, e.g. boron trichloride. The apparatus is likewise conventional. Preferably, the method of this invention is carried out in a planar reactor such as described by Vossen in an article entitled, "Plasma Deposition and Etching Reactors for Semiconductor Applications" in Pure & Appl. Chem., Vol. 52, pp. 1759–1765, 1980.

The method of this invention dramatically reduces undercutting and improves etch uniformity, but does not produce absolute anisotropic etching. The mechanism by which this occurs is not known with certainty. Utilizing the method of this invention with adequate endpoint detection, however, features of 2.5–3.0 micrometers can be satisfactorily produced in a substrate of aluminum or an alloy thereof in a production environment.

The method of this invention is advantageously combined with the improvement disclosed and claimed in copending application Ser. No. 362,044, filed concurrently herewith and incorporated herein by reference. In that application, a gettering means is provided which reduces the amount of reactive gases at the edge of the substrate, thus producing a more uniform etch rate across the substrate. A greater reduction in undercutting is obtained by combining the method of this invention with the gettering means disclosed in that application.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

A series of 1 micrometer thick aluminum coated silicon wafers were utilized as substrates. The wafers were overcoated with a finely patterned resist layer. The line width in the pattern was 2.5 micrometers. The wafers were placed in groups of two into a parallel electrode etching reactor.

One group of two substrates was etched conventionally as a control. These substrates were etched with a mixture of boron trichloride and chlorine in a partial pressure ratio of 96.5:3.5. The pressure was 250 mtorr and the total etchant gas flow was 100.5 sccm.

A second and third group of two substrates were etched in a similar manner using the same etchant gas mixture except that cyclopropane was added in $1.7 \times 10^{-6}$ percent by volume at 250 mtorr pressure and 100.5 sccm total flow, and $1.3 \times 10^{-5}$ percent by volume at 125 mtorr pressure and 51.8 sccm total flow, respectively. The results of these etching runs are plotted in the FIGURE.

It can be seen from the FIGURE that the etch is not uniform across the surface of a 3 inch (72 mm) substrate. It is clear from the FIGURE that the method of this invention provides a significantly more uniform etch with materially reduced undercutting than the prior art method.

We claim:

1. In a process of plasma etching aluminum or an alloy thereof with an etchant gas which will isotropically etch the sidewalls of patterns being etched, the improvement comprising adding to the etchant gas gaseous hydrocarbon which will polymerize under conditions of glow discharge in an amount effective to reduce sidewall etching.

2. A process in accordance with claim 1, wherein said etchant gas contains boron trichloride.

3. A process in accordance with claim 2, wherein said etchant gas is a mixture of boron trichloride and chlorine.

4. A process in accordance with claim 2, wherein said etchant gas is a mixture of boron trichloride, chlorine and helium.

5. A process in accordance with claim 1, wherein the gaseous hydrocarbon is selected from the group consisting of ethylene, cyclopropane and mixtures thereof.

6. The process in accordance with claim 5, wherein the gaseous hydrocarbon is cyclopropane.

7. The process in accordance with claim 1, wherein the amount of gaseous hydrocarbon added to the etchant gas mixture is from about $7 \times 10^{-6}$ to about $2.5 \times 10^{-5}$ percent by volume when the total flow of etching gas is about 50 sccm and the pressure is about 125 mtorr.

* * * * *